United States Patent
Timmermans

(10) Patent No.: US 7,459,709 B2
(45) Date of Patent: Dec. 2, 2008

(54) METHOD OF FORMING OPTICAL IMAGES, A CONTROL CIRCUIT FOR USE WITH THIS METHOD, APPARATUS FOR CARRYING OUT SAID METHOD AND PROCESS FOR MANUFACTURING A DEVICE USING SAID METHOD

(75) Inventor: Roger Timmermans, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 334 days.

(21) Appl. No.: 10/569,187

(22) PCT Filed: Aug. 9, 2004

(86) PCT No.: PCT/IB2004/051421

§ 371 (c)(1),
(2), (4) Date: Feb. 22, 2006

(87) PCT Pub. No.: WO2005/022263

PCT Pub. Date: Mar. 10, 2005

(65) Prior Publication Data

US 2006/0261289 A1 Nov. 23, 2006

(30) Foreign Application Priority Data

Aug. 27, 2003 (EP) .................................. 03103227

(51) Int. Cl.
*G03F 7/20* (2006.01)
(52) U.S. Cl. ........................ 250/548; 369/67
(58) Field of Classification Search ............... 250/548; 355/67
See application file for complete search history.

(56) References Cited

U.S. PATENT DOCUMENTS

| 5,936,713 | A | 8/1999 | Paufler et al. |
| 6,133,986 | A | 10/2000 | Johnson |
| 6,285,488 | B1 | 9/2001 | Sandstrom |
| 6,897,941 | B2 * | 5/2005 | Almogy ........................ 355/67 |
| 7,187,399 | B2 * | 3/2007 | Noguchi et al. ............. 347/241 |
| 7,253,881 | B2 * | 8/2007 | Lof et al. ....................... 355/55 |
| 7,339,602 | B2 * | 3/2008 | Shimoyama et al. ........ 347/238 |

FOREIGN PATENT DOCUMENTS

EP 1316850 A1 6/2003

OTHER PUBLICATIONS

Dario Gil, et al: Lithographic Patterning and Confocal Imaging with Zone Plates, Aug. 2000, pp. 2881-2885.

* cited by examiner

*Primary Examiner*—John R Lee

(57) ABSTRACT

An optical image is formed in a radiation-sensitive layer (5), by a number of sub-illuminations, in each of which an array of light valves (21-25) and a corresponding array (40) of converging elements (43) are used to form a pattern of spots in the resist layer (5) in accordance with a sub-image pattern. Between the sub-illuminations, the resist layer (5) is displaced relative to the arrays (21-25, 40). The lens array (40) may be tilted with respect to the scan area, such that each resist layer area is scanned by a number of spots. In addition, some spot overlap also occurs in a direction perpendicular to the scan direction. This spot redundancy is utilised by selectively reducing the intensity, or switching off, one or more of the redundant spots so as to alter the position of an edge of a device feature, i.e. "fine tune" it.

21 Claims, 3 Drawing Sheets

METHOD OF FORMING OPTICAL IMAGES, A CONTROL CIRCUIT FOR USE WITH THIS METHOD, APPARATUS FOR CARRYING OUT SAID METHOD AND PROCESS FOR MANUFACTURING A DEVICE USING SAID METHOD

The invention relates to a method of forming an optical image in a radiation-sensitive layer, the method comprising the steps of:
providing a radiation source;
providing a radiation-sensitive layer;
positioning a plurality of individually controlled light valves between the radiation source and the radiation-sensitive layer;
positioning a plurality of radiation-converging elements between the plurality of light valves and the radiation-sensitive layer, such that each converging element corresponds to a different one of the light valves and serves to converge radiation from the corresponding light valve in a spot area in the radiation-sensitive layer;
simultaneously writing image portions in radiation-sensitive layer areas by scanning said layer, on the one hand, and the associated light valve/converging element pairs, on the other hand, relative to each other and switching each light valve between an on and an off state in dependence upon the image portion to be written by the light valve.

The invention also relates to an apparatus for carrying out this method, a control circuit for use in this method, and to a method of manufacturing a device using this method.

The light valves and radiation-converging elements are preferably arranged in a two-dimensional array. An array of light valves, or optical shutters, is understood to mean an array of controllable elements, which can be switched between two states. In one of the states radiation incident on such an element is blocked and in the other state the incident radiation is transmitted or reflected to follow a path that is prescribed in the apparatus of which the array forms part.

Such an array may be a transmissive or reflective liquid crystal display (LCD) or a digital mirror device (DMD). The radiation-sensitive layer is, for example, a resist layer used in optical lithography, or an electrostatic charged layer used in a printing apparatus.

This method and apparatus may be used, inter alia, in the manufacture of devices such as liquid crystal display (LCD) panels, customized-ICs (integrated circuits) and PCBs (printed circuit board). Currently, proximity printing is used in the manufacture of such devices. Proximity printing is a fast and cheap method of forming an image in a radiation-sensitive layer on a substrate of the device, which image comprises features corresponding to device features to be configured in a layer of the substrate. Use is made of a large photomask that is arranged in a short distance, called the proximity gap, from the substrate, and the substrate is illuminated via the photomask by, for example, ultraviolet (UV) radiation. An important advantage of the method is the large image field, so that large device patterns can be imaged in one image step. The pattern of a conventional photomask for proximity printing is a true, one-to-one copy, of the image required on the substrate, i.e. each picture element (pixel) of this image is identical to the corresponding pixel in the mask pattern.

Proximity printing has a limited resolution, i.e. the ability to reproduce the points, lines etc., in general the features, of the mask pattern as separate entities in the sensitive layer on the substrate. This is due to the diffractive effects, which occur when the dimensions of the features decrease with respect to the wavelength of the radiation used for imaging. For example, for a wavelength in the near UV range and a proximity gap width of 100 µm, the resolution is 10 µm, which means that pattern features at a mutual distance of 10 µm can be imaged as separate elements.

To increase the resolution in optical lithography, a real projection apparatus is used, i.e. an apparatus having a real projection system like a lens projection system or a mirror projection system. Examples of such apparatus are wafer steppers or wafer step-and scanners. In a wafer stepper, a whole mask pattern, for example, an IC pattern is imaged in one go by a projection lens system on a first IC area of the substrate. Then the mask and substrate are moved (stepped) relative to each other until a second IC area is positioned below the projection lens. The mask pattern is then imaged on the second IC area. These steps are repeated until all IC areas of the substrate are provided with an image of the mask pattern. This is a time-consuming process, due to the sub-steps of moving, aligning and illumination. In a step-and-scanner, only a small portion of the mask pattern is illuminated at once. During illumination, the mask and the substrate are synchronously moved with respect to the illumination beam until the whole mask pattern has been illuminated and a complete image of this pattern has been formed in an IC area of the substrate. Then the mask and substrate are moved relative to each other until the next IC area is positioned under the projection lens and the mask pattern is again scan-illuminated, so that a complete image of the mask pattern is formed on the next IC area. These steps are repeated until all IC areas of the substrate are provided with a complete image of the mask pattern. The step-and-scanning process is even more time-consuming than the stepping process.

If a 1:1 stepper, i.e. a stepper with a magnification of one, is used to print an LCD pattern, a resolution of 3 µm can be obtained, however, at the expense of much time for imaging. Moreover, if the pattern is large and has to be divided into sub-patterns, which are imaged separately, stitching problems may occur, which means that neighbouring sub-fields do not fit exactly together.

The manufacture of a photomask is a time-consuming and cumbersome process, which renders such a mask expensive. If much re-design of a photomask is necessary or in case customer-specific devices, i.e. a relatively small number of the same device, have to be manufactured, the lithographic manufacturing method using a photomask is an expensive method.

The paper "Lithographic patterning and confocal imaging with zone plates" of D. Gil et al in: J. Vac. Sci. Technology B 18(6), November/December 2000, pages 2881-2885, describes a lithographic method wherein, instead of a photomask, a combination of a DMD array and an array of zone plates is used. If the array of zone plates, also called Fresnel lenses, is illuminated, it produces an array of radiation spots, in the experiment described in the paper: an array of 3×3 X-ray spots, on a substrate. The spot size is approximately equal to the minimum feature size, i.e. the outer zone width, of the zone plate. The radiation to each zone plate is separately turned on and off by the micromechanic means of the DMD device, and arbitrary patterns can be written by raster scanning the substrate through a zone plate unit cell. In this way, the advantages of maskless lithography are combined with a high throughput due to parallel writing with an array of spots.

In many flexible lithography systems (i.e. lithography systems with a changeable light pattern), the lens array is tilted with respect to the scan area, such that each substrate area is scanned by a number of spots. In addition, some spot overlap also occurs in the direction perpendicular to the scan direction. Both of these situations may have an adverse effect of the resolution of the resultant optical image, particularly at the edges of features of a device being manufactured, which has an adverse effect on the alignment performance which can be achieved by the device.

It is an object of the present invention to solve the above-mentioned problems and to provide an accurate and radiation-efficient lithographic imaging method.

In accordance with the present invention, there is provided a method of forming an optical image in a radiation-sensitive layer, the method comprising the steps of:

providing a radiation source;

providing a radiation-sensitive layer;

positioning a plurality of individually controlled light valves between the radiation source and the radiation sensitive layer;

positioning a plurality of radiation converging elements between the plurality of light valves and the radiation-sensitive layer, such that each converging element corresponds to a different one of the light valves and serves to converge radiation from the corresponding light valve in a spot area in the radiation-sensitive layer;

simultaneously writing image portions in radiation-sensitive layer areas by scanning said layer, on the one hand, and the associated light valve/converging-element pairs, on the other hand, relative to each other and switching each light valve between an on and an off state in dependence upon the image portion to be written by the light valve, wherein at least some spot areas in the radiation-sensitive layer are scanned by a plurality of spots created by respective light valve/converging element pairs; the method being characterized by the step of:

selectively reducing the intensity of, or switching off, one or more of said plurality of spots scanning the same spot area in said radiation-sensitive layer so as to adjust the position in said radiation-sensitive layer of an edge portion of said optical image.

Thus, the edges of features written into the radiation-sensitive layer can be effectively "fine-tuned", such that the writing grid defined by the pitch of the radiation-converging elements and the angle of the set of converging elements with respect to the substrate can be improved, and a better alignment performance can be achieved.

Often, the resist used in photolithography requires a minimum "dose" (i.e. spot intensity) to "clear" (i.e. write an image portion). Thus, the edge of a feature, in this case, is determined by an intersection (if displayed graphically) between a threshold and the total intensity applied to a spot area. Thus, in a preferred embodiment, the one or more spots are selectively switched off (or their intensity is reduced), whilst maintaining a total intensity at a spot area equal to or above the threshold.

The method of the present invention may be further characterized in that, between successive sub-illuminations, the radiation-sensitive layer and the arrays are displaced relative to each other over a distance which is at most equal to the size of the spots formed in the radiation-sensitive layer.

In this way, image, i.e. pattern, features can be written with a constant intensity across the whole feature. The spots may have a circular, square, diamond or rectangular shape, dependent on the design of a beam-shaping aperture present in the apparatus. The size of the spot is understood to mean the size of the largest dimension within this spot.

If features of the image to be written are very close to each other, these features may broaden and blend with each other, which phenomenon is known as the proximity effect. An embodiment of the method, which prevents proximity effects from occurring, is characterized in that the intensity of a spot at the border of an image feature is adapted to the distance between this feature border and a neighbouring feature.

The method can be used in several applications. A first application is in the field of optical lithography. An embodiment of the method, which is suitable to form part of a lithographic process for producing a device in a substrate, is characterized in that the radiation-sensitive layer is a resist layer provided on the substrate, and in that image pattern corresponds to the pattern of features of the device to be produced.

This embodiment of the method may be further characterized in that the image is divided into sub-images each belonging to a different level of the device to be produced, and in that, during formation of the different sub-images, the resist layer surface is set at different distances from the plurality of converging elements (which may comprise an array of refractive lenses).

This embodiment of the method allows imaging on different planes of the substrate and thus production of multiple level devices.

A second application is in the field of printing. An embodiment of the method, which is suitable to form part of a process for printing a sheet of paper, is characterized in that the radiation-sensitive layer is a layer of electrostatically charged material.

The light valves and converging elements are preferably arranged in corresponding two-dimensional arrays.

The method can be further characterized in that a two-dimensional array of light valves is positioned to directly face a corresponding array of converging elements (e.g. refractive lenses).

The two arrays are positioned close to each other, without imaging means being arranged between them, so that the method can be performed by compact means. If the array of light valves is an array of LCD cells, which modulate the polarization of incident radiation, a polarization analyzer is arranged between the LCD and the array of converging elements (e.g. diffraction cells or refractive lenses).

Alternatively, the method may be characterized in that the array of light valves is imaged on the array of converging elements.

Imaging one array on the other by a projection lens provides advantages with respect to stability, thermal effects, and crosstalk.

The invention also relates to an apparatus for carrying out the method described above. This apparatus comprises:

a radiation source;

positioning means for positioning a radiation-sensitive layer relative to the radiation source;

a plurality of individually controllable light valves arranged between the source and the location for the radiation-sensitive layer;

an imaging element comprising a plurality of radiation-converging elements arranged between the plurality of light valves and the location of the radiation-sensitive layer, such that each converging element corresponds to a different one of the light valves and serves to converge radiation from the corresponding light valve in a spot area in the radiation-sensitive layer;

writing means for simultaneously writing image portions in radiation-sensitive layer areas by scanning the layer, on the one hand, and the associated light valve/converging-element pairs, on the other hand, relative to each other and switching each light valve between an on and an off state in dependence upon the image portion to be written by the light valve, wherein at least some spot areas in the radiation-sensitive layer are scanned by a plurality of spots created by respective light valve/converging element pairs:

the apparatus being characterized by:

control means for selectively reducing the intensity of, or switching off, one or more of said plurality of spots scanning the same spot area in said radiation-sensitive layer so as to adjust the position in said radiation-sensitive layer of an edge portion of said optical image.

A first embodiment of the apparatus, suitable for forming an image in a resist layer on a substrate, which image comprises features corresponding to device features to be configured in said substrate, is characterized in that the radiation-sensitive layer is a resist layer, and in that the positioning means is a substrate holder carried by a substrate stage.

This embodiment may be adapted to allow sub-images to be formed in different planes of the substrate and is then characterized in that it comprises means for adapting the distance between the resist layer surface and the imaging element when forming different sub-images.

A second embodiment of the apparatus is suitable for printing data on a sheet of paper, is characterized in that the radiation-sensitive layer is a layer of electrostatically charged radiation-sensitive material, and in that the positioning means are means for moving said layer relative to the array of light valves and the array of refractive lenses and for sustaining said layer at the location of the image field of these arrays.

The term data is understood to encompass all visual information that can be printed on paper, such as text, graphics, photos, etc.

The apparatus may be further characterized in that the imaging element is arranged behind the plurality (preferably an array) of light valves without intervening imaging means.

The gap, for example an air gap, may be very small so that this embodiment has a sandwich shape. If the array of light valves is an LCD, a polarization analyzer is arranged between the array of light valves and the imaging element.

An embodiment of the apparatus, which is alternative to the sandwich embodiment, is characterized in that a projection lens is arranged between the array of light valves and the imaging element.

The projection lens images each light valve on its associated refractive lens in the imaging element so that crosstalk, optical aberrations and temperature effects are eliminated. Moreover, the substrate of the imaging element may be relatively thick so that the apparatus is more stable.

The invention also relates to a method of manufacturing a device in at least one process layer of a substrate, the method comprising the steps of:

forming an image, comprising features corresponding to device features to be configured in the process layer, in a resist layer provided on the process layer; and removing material from, or adding material to, areas of the process layer which areas are delineated by the image formed in the resist layer.

This method is characterized in that the image is formed by means of the method as described above.

Devices, which can be manufactured by means of this method and apparatus, are liquid crystal display devices, customer-specific ICs, electronic modules, printed circuit boards and MOEMS (integrated Micro-Optical-Electrical-Mechanical System), etc. An example of such a device is an integrated optical telecommunication device comprising a diode laser and/or detector, a light guide, an optical switch and possibly a lens between the light guide and the diode laser, or the detector.

The present invention further extends to a control circuit for use in the apparatus and method described above, the control circuit being characterized in that it is configured to selectively reduce the intensity of, or switch off, one or more of the plurality of spots scanning the same area in the radiation-sensitive layer so as to adjust the position in the radiation-sensitive layer of an edge optical image.

These and other aspects of the invention are apparent from and will be elucidated, by way of non-limitative example, with reference to the embodiments described hereinafter.

An embodiment of the present invention will now be described by way of example only, and with reference to the accompanying drawings, in which.

Figure 1:
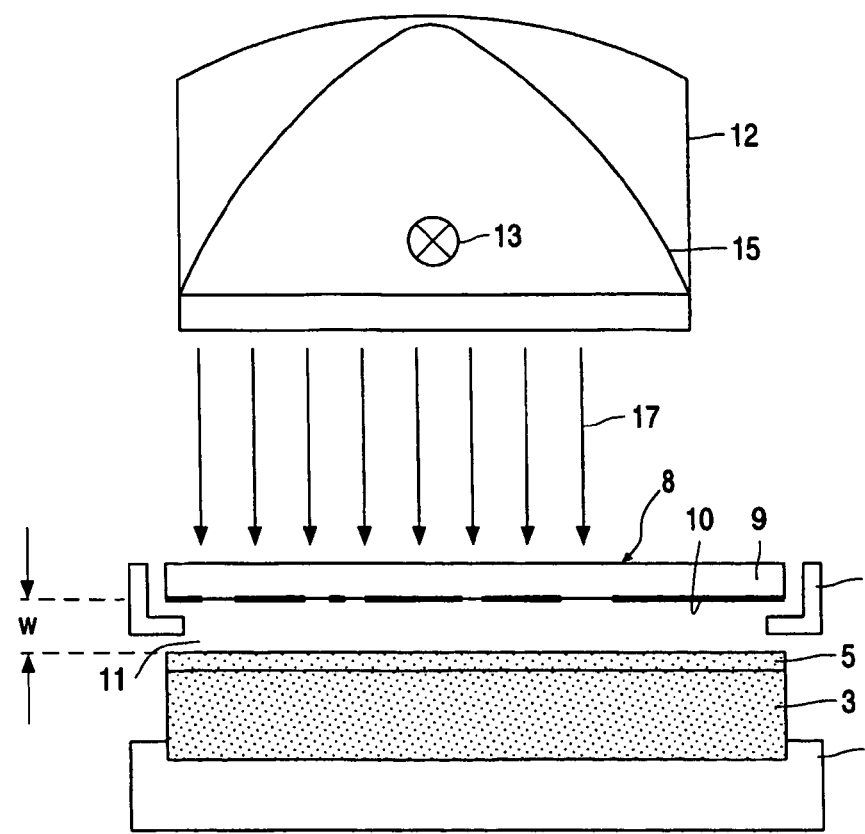
FIG. 1 illustrates schematically a conventional proximity printing apparatus.

FIG. 1 shows, very schematically, a conventional proximity printing apparatus for the manufacture of, for example, an LCD device. This apparatus comprises a substrate holder 1 for carrying a substrate 3 on which the device is to be manufactured. The substrate is coated with a radiation-sensitive, or resist, layer 5 in which an image, having features corresponding to the device features, is to be formed. The image information is contained in a mask 8 arranged in a mask holder 7. The mask comprises a transparent substrate 9, the lower surface of which is provided with a pattern 10 of transparent and non-transparent strips and areas, which represent the image information. A small air gap 11 having a gap width w of the order of 100 μm separates the pattern 10 from the resist layer 5. The apparatus further comprises a radiation source 12. This source may comprise a lamp 13, for example, a mercury arc lamp, and a reflector 15. This reflector reflects lamp radiation, which is emitted in backward and sideways directions towards the mask. The reflector may be a parabolic reflector and the lamp may be positioned in a focal point of the reflector, so that the radiation beam 17 from the radiation source is substantially a collimated beam. Other or additional optical elements, like one or more lenses, may be arranged in a radiation source to ensure that the beam 17 is substantially collimated. This beam is rather broad and illuminates the whole mask pattern 10 which may have dimensions from 7.5×7.5 cm$^2$ to 40×40 cm$^2$ For example, illumination step has a duration of the order of 10 seconds. After the mask pattern has been imaged in the resist layer, this is processed in the well-known way, i.e. the layer is developed and etched, so that the optical image is transferred in a surface structure of the substrate layer being processed.

The apparatus of FIG. 1 has a relatively simple construction and is very suitable for imaging in one go a large area mask pattern in the resist layer. However, the photomask is an expensive component and the price of a device manufactured by means of such a mask can be kept reasonably low only if a large number of the same device is manufactured. Mask making is a specialized technology, which is in the hands of a relatively small number of mask manufacturing firms. The time a device manufacturer needs for developing and manufacturing a new device or for modifying an existing device is strongly dependent on delivery times set by the mask manufacturer. Especially in the development phase of a device, when redesigns of the mask are often needed, the mask is a capability-limiting element. This is also the case for low-volume, customer-specific devices.

Direct writing of a pattern in the resist layer, for example by an electron beam writer or a laser beam writer, could provide the required flexibility, but is not a real alternative because this process takes too much time.

Figure 2:
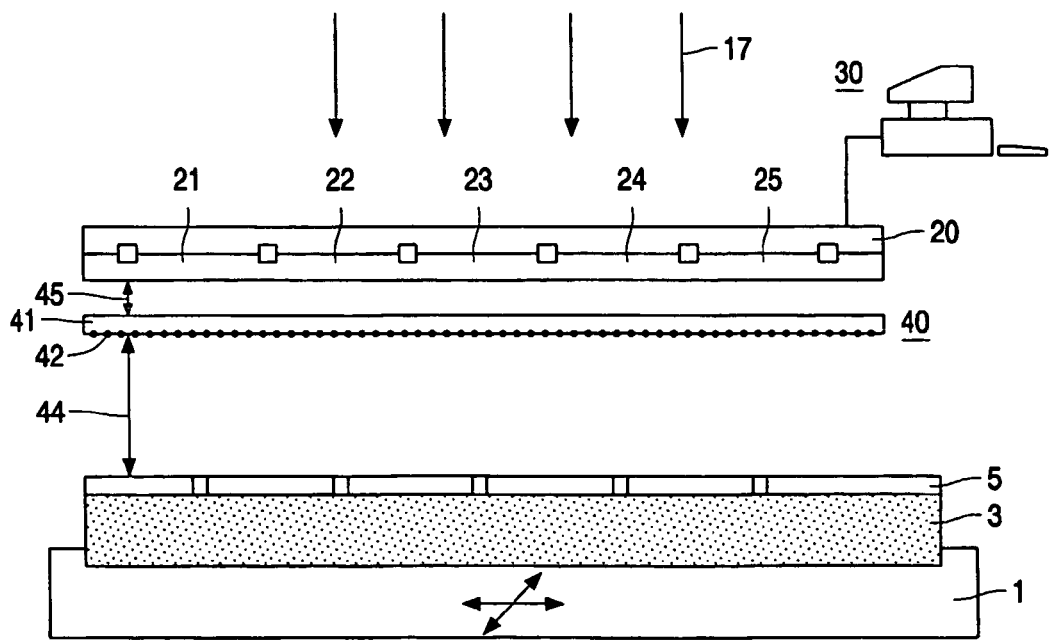
FIG. 2 shows an embodiment of an imaging apparatus according to the invention.

FIG. 2 shows the principle of a maskless method and apparatus by means of which an arbitrary and easily changeable image pattern can be formed in a resist layer within a reasonable time. FIG. 2 shows very schematically and in a vertical cross-section a small portion of the means which are used for performing the method and form part of the apparatus. The apparatus comprises a substrate holder 1 for accommodating a substrate 3, which is coated with a resist layer 5. Reference numeral 20 denotes a light valve device, for example a liquid crystal display (LCD), which is currently used in a display apparatus for displaying information, either in direct-view or in projection. Device 20 comprises a large number of light valves, also called pixels (picture elements) of which only a few are shown in FIG. 2 and denoted by reference numerals 21 to 25. The light valve device is controlled by a computer configuration 30 (not on scale) wherein the pattern, which is to be configured in a substrate layer, is introduced in software. The computer thus determines, at any moment of the writing process and for every light valve, whether it is closed, i.e. blocks the portion of the illuminating beam 17 incident on this light valve, or is open, i.e. transmits this portion to the resist layer. An imaging element 40 is arranged between the array of light valves 20 and the resist layer 5. This element comprises a transparent substrate 41 and an array 42 of radiation-converging elements 43. The number of these elements corresponds to the number of light valves, and the array 42 is aligned with the array of light valves so that each converging element belongs to a different one of the light valves.

As the radiation source (which may be ultra-violet (UV) but could be one of a number of other types of radiation), the substrate holder and the mask holder are less relevant for understanding the new method, these elements will not be described in detail.

Often, the lens array 42 (and light valves 20) arrangement is tilted relative to the scan direction, such that at least some spot areas in the resist layer 5 are scanned by a plurality of spots created by the lens/light valve pairs. In other words, redundant radiation (UV, say) spots are available covering the same scan line on the substrate 3. Depending on the tilt of the arrays 42, 20, a number of (say 3 to 20) redundant spots are available at exactly the same position. The spots are likely to be bigger than the "virtual pitch", and therefore spot-overlap also tends to occur in the direction transverse to the scan direction, as illustrated in FIG. 3.

Figure 3:
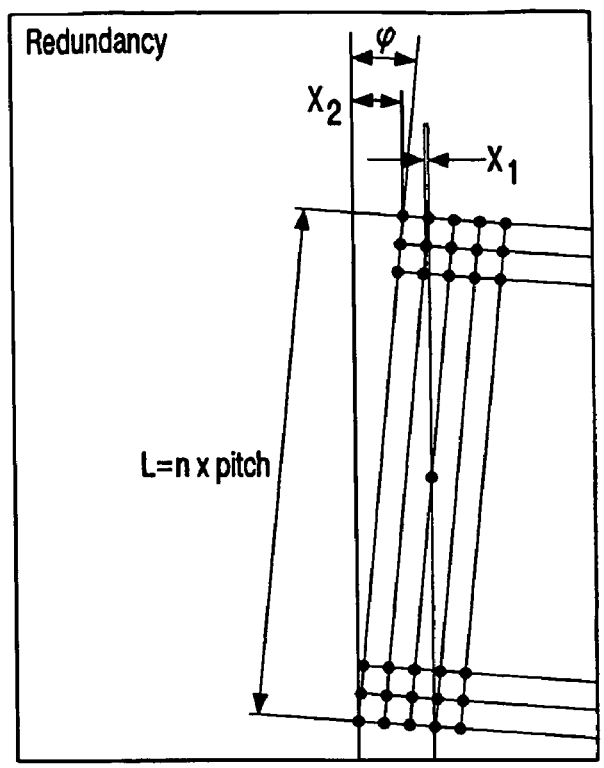
FIG. 3 illustrates schematically the occurrence of spot overlap.
Figure 4:
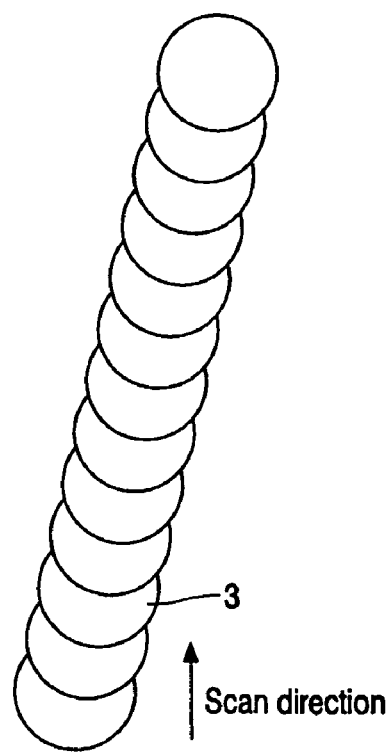
FIG. 4 illustrates schematically the manifestation of spot overlap as described with reference to FIG. 3.

Referring to FIG. 3 of the drawings, in a tilted micro lens array of M by N lenslets, each lenslet is shifted in X by P.sin (Q) if Q is the tilt angle. In FIG. 4, the overlap of spots is schematically shown.

Figure 5:
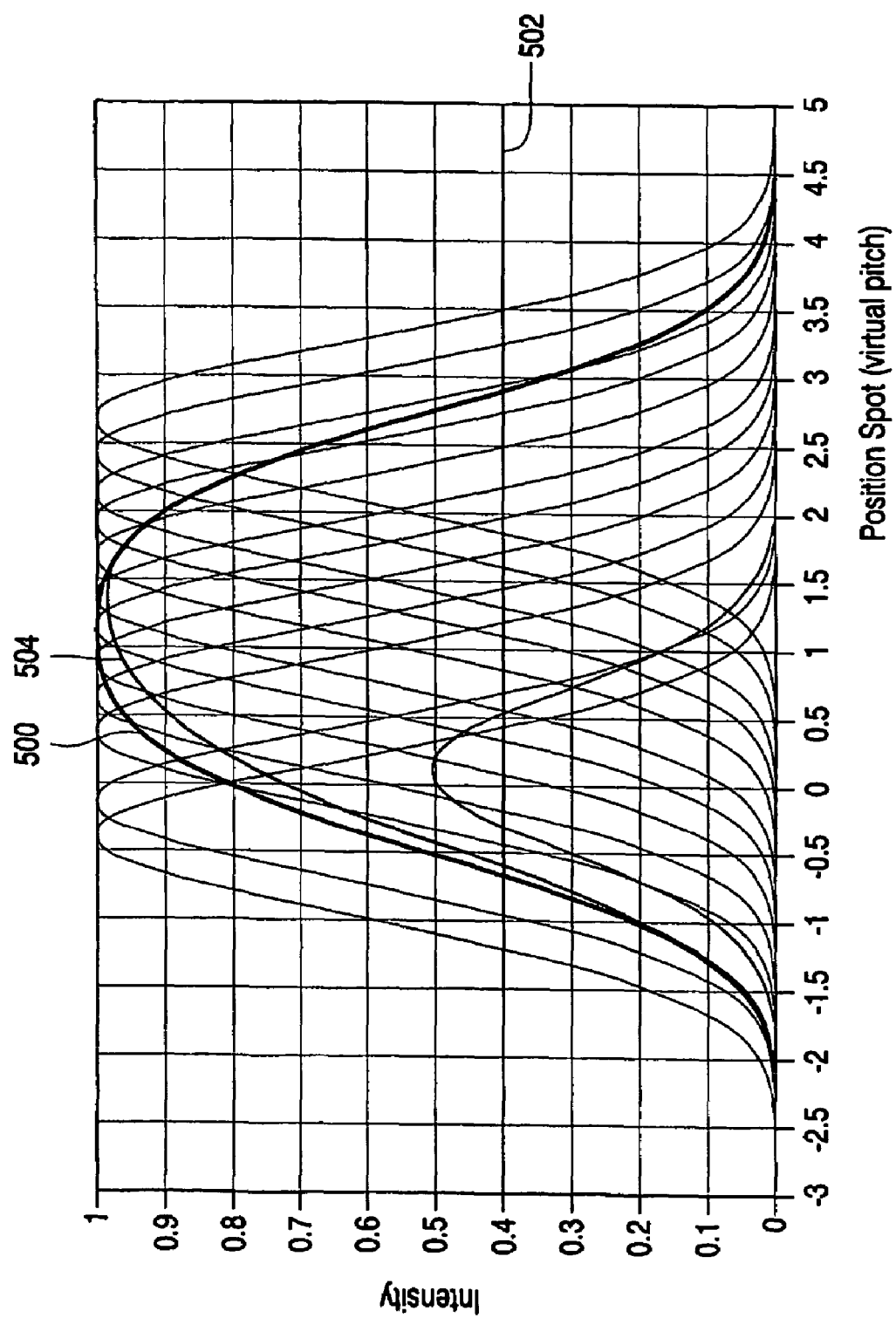
FIG. 5 illustrates graphically a typical total spot area intensity vs. the position of a spot in the radiation-sensitive layer.

The total intensity falls at a spot area in the resist layer is the sum of the individual spot intensities. Referring to FIG. 5 of the drawings, if a spot area can be described by a Ganssian, the total intensity may be illustrated by the curve 500.

Often the resist used in photolithography requires a minimum dose (i.e intensity) to "clear" (i.e. for the image portion to be written). Therefore, the edge of the feature is determined by the intersection of the so-called "threshold" (line 502) and the total intensity. If all spots are of equal intensity, the total intensity (curve 500) is symmetric and at the intersection with the threshold 502, the edge of the feature will result.

However, if spot number 3 (see FIG. 4) is switched off (or has less intensity than the other spots), the resultant curve 504 (i.e. the total intensity of the spots) becomes asymmetric. Therefore the feature edge at the left-hand side (defined by the intersection between curve 504 and the threshold 502) is shifted slightly to the right. The edge on the right-hand side is not affected because spot 3 is sufficiently distanced from this edge.

Thus, the example provided above illustrates that the present invention provides the possibility to adjust the edge position of a feature in a fine, high resolution manner (less than the pitch of the spots), and if the width of the feature is big enough, the opposite edge is not affected.

It will be appreciated that more than one spot can be switched off (or its intensity reduced) so as to adjust the edge position, provided the remaining total intensity is sufficient to "clear" the feature.

The present invention is applicable to any flexible lithographic system wherein the mask is formed by an array of light valves and a corresponding array of radiation converging elements (preferably microlenses) close to the substrate.

It should be noted that the above-mentioned embodiment illustrates rather than limits the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of forming an optical image in a radiation-sensitive layer (5), the method comprising the steps of:
   providing a radiation source (17);
   providing a radiation-sensitive layer (5);
   positioning a plurality of individually controlled light valves (21-25) between the radiation source (17) and the radiation sensitive layer (5);
   positioning a plurality of radiation converging elements (43) between the plurality of light valves (21-25) and the radiation-sensitive layer (5), such that each converging element (43) corresponds to a different one of the light valves (21-25) and serves to converge radiation from the corresponding light valve in a spot area in the radiation-sensitive layer (5);
   simultaneously writing image portions in radiation-sensitive layer areas by scanning said layer (5), on the one hand, and the associated light valve/converging-element pairs, on the other hand, relative to each other and switching each light valve (21-25) between an on and an off state in dependence upon the image portion to be written by the light valve (21-25),
   wherein at least some spot areas in the radiation-sensitive layer (5) are scanned by a plurality of spots created by respective light valve/converging element pairs;

selectively reducing the intensity of, or switching off, one or more of said plurality of individually controlled light valves (21-25) scanning the same spot area in said radiation-sensitive layer (5) so as to adjust the position in said radiation-sensitive layer (5) of an edge position of a feature of said optical image.

2. A method according to claim 1, wherein an edge portion of a feature is determined by an intersection between a threshold and the total intensity of radiation applied to a spot area.

3. A method according to claim 2, wherein said threshold is a minimum intensity of radiation required to form the image portion on the radiation-sensitive layer (5), and the one or more spots are selectively switched off (or their intensity is reduced), whilst maintaining a total intensity at a spot area equal to or above the threshold.

4. A method according to claim 1, wherein between successive sub-illuminations, the radiation-sensitive layer (5) and the light valve/converging element pairs are displaced relative to each other over a distance which is at most equal to the size of the spots formed in the radiation-sensitive layer (5).

5. A method according to claim 1, wherein the intensity of a spot at the border of an image feature is adapted to the distance between this feature border and a neighboring feature.

6. A method according to claim 1, forming part of a lithographic process for producing a device in a substrate (3), characterized in that the radiation-sensitive layer (5) is a resist layer provided on the substrate (3), and in that image pattern corresponds to the pattern of features of the device to be produced.

7. A method according to claim 6, further characterized in that the image is divided into sub-images each belonging to a different level of the device to be produced, and in that, during formation of the different sub-images, the resist layer surface is set at different distances from the plurality of converging elements.

8. A method according to claim 1, forming part of a process for printing a sheet of paper, characterized in that the radiation-sensitive layer (5) is a layer of electrostatically charged material.

9. A method according to claim 1, wherein said plurality of light valves (21-25) is positioned to directly face said plurality of converging elements (43).

10. A method according to claim 1, wherein the light valves (21-25) and converging elements (43) are arranged in corresponding two-dimensional arrays.

11. A method according to claim 1, characterized in that the plurality of light valves (21-25) is imaged on the plurality of converging elements (43).

12. Apparatus for forming an optical image in a radiation-sensitive layer (5), the apparatus comprising:
a radiation source (17);
positioning means for positioning a radiation-sensitive layer (5) relative to the radiation source (17);
a plurality of individually controllable light valves (21-25) arranged between the source (17) and the location of the radiation-sensitive layer (5);
an imaging element (40) comprising a plurality of radiation-converging elements (43) arranged between the plurality of light valves (21-25) and the location of the radiation-sensitive layer (5), such that each converging element (43) corresponds to a different one of the light valves (21-25) and serves to converge radiation from the corresponding light valve (21-25) in a spot area in the radiation-sensitive layer (5);
writing means for simultaneously writing image portions in radiation-sensitive layer areas by scanning the layer (5), on the one hand, and the associated light valve/converging-element pairs, on the other hand, relative to each other and switching each light valve (21-25) between an on and an off state in dependence upon the image portion to be written by the light valve (21-25), wherein at least some spot areas in the radiation-sensitive layer (5) are scanned by a plurality of spots created by respective light valve/converging element pairs:
control means for selectively reducing the intensity of, or switching off, one or more of said plurality of individually controlled light valves (21-25) scanning the same spot area in said radiation-sensitive layer (5) so as to adjust the position in said radiation-sensitive layer (5) of an edge position of a feature of said optical image.

13. Apparatus according to claim 12 for forming an image in a resist layer (5) on a substrate (3), which image comprises features corresponding to device features to be configured in said substrate (3), characterized in that the radiation-sensitive layer (5) is a resist layer, and in that the positioning means is a substrate holder (1) carried by a substrate stage.

14. Apparatus according to claim 13, characterized in that it comprises means for adapting the distance between the resist layer surface (5) and the imaging element (40) when forming different sub-images in different planes of the substrate (3).

15. Apparatus according to claim 12, for printing data on a sheet of paper characterized in that the radiation-sensitive layer (5) is a layer of electrostatically charged radiation-sensitive material, and in that the positioning means are means for moving said layer (5) relative to the plurality of light valves (21-25) and the plurality of converging elements (43) and for sustaining said layer (5) at the location of the image field of said light valve/converging element pairs.

16. Apparatus according to claim 12, further characterized in that the imaging element (40) is arranged behind the plurality of light valves (21-25) without intervening imaging means.

17. Apparatus according to claim 12, wherein said light valves (21-25) and converging elements (43) are arranged in corresponding two-dimensional arrays.

18. Apparatus according to claim 12, wherein the plurality of light valves (21-25) comprises an LCD and a polarization analyzer is arranged between the plurality of light valves (21-25) and the imaging element (40).

19. Apparatus according to claim 12, wherein a projection lens is arranged between the plurality of light valves (21-25) and the imaging element (40).

20. A method of manufacturing a device in at least one process layer (5) of a substrate (3), the method comprising the steps of: forming an image, comprising features corresponding to device features to be configured in the process layer, in a resist layer provided on the process layer; and removing material from, or adding material to, areas of the process layer which areas are delineated by the image formed in the resist layer, characterized in that the image is formed by means of a method according to claim 1.

21. A control circuit for use in the method according to claim 1, the control circuit being characterized in that it is configured to selectively reduce the intensity of, or switch off, one or more of the plurality of spots scanning the same area in the radiation-sensitive layer (5) so as to adjust the position in the radiation-sensitive layer (5) of an edge feature of said optical image.

* * * * *